United States Patent
Konchady et al.

(10) Patent No.: US 9,704,735 B2
(45) Date of Patent: Jul. 11, 2017

(54) DUAL SIDE SOLDER RESIST LAYERS FOR CORELESS PACKAGES AND PACKAGES WITH AN EMBEDDED INTERCONNECT BRIDGE AND THEIR METHODS OF FABRICATION

(71) Applicants: Manohar S. Konchady, Chandler, AZ (US); Tao Wu, Chandler, AZ (US); Mihir K. Roy, Chandler, AZ (US); Wei-Lun K. Jen, Chandler, AZ (US); Yi Li, Chandler, AZ (US)

(72) Inventors: Manohar S. Konchady, Chandler, AZ (US); Tao Wu, Chandler, AZ (US); Mihir K. Roy, Chandler, AZ (US); Wei-Lun K. Jen, Chandler, AZ (US); Yi Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/463,285

(22) Filed: Aug. 19, 2014

(65) Prior Publication Data

US 2016/0056102 A1 Feb. 25, 2016

(51) Int. Cl.
*H01L 21/683* (2006.01)
*H01L 23/538* (2006.01)
*H01L 23/498* (2006.01)

(52) U.S. Cl.
CPC ...... *H01L 21/6835* (2013.01); *H01L 23/5383* (2013.01); *H01L 23/5389* (2013.01);
(Continued)

(58) Field of Classification Search
CPC ............ H01L 2224/02135; H01L 2224/02175
See application file for complete search history.

(56) References Cited

U.S. PATENT DOCUMENTS 7,727,802 B2    6/2010  Sunohara et al.
8,127,979 B1 *  3/2012  Wu et al. ................. 228/180.22
(Continued)

FOREIGN PATENT DOCUMENTS

JP    2004-363475 A    12/2004
JP    2006-287099 A    10/2006
(Continued)

OTHER PUBLICATIONS

Notice of Preliminary Rejection from the Korean Intellectual Property Office dated Apr. 6, 2016 for Korean Patent Application No. 2015-0101870 and English Translation thereof.
(Continued)

*Primary Examiner* — Kevin Parendo
(74) *Attorney, Agent, or Firm* — Blakely, Sokoloff, Taylor & Zafman LLP

(57) ABSTRACT

A coreless package substrate with dual side solder resist layers is disclosed. The coreless package substrate has a top side and a bottom side opposite of the top side and includes a single build-up structure formed of at least one insulating layer, at least one via, and at least one conductive layer. The coreless package substrate also includes a bottom plurality of contact pads on the bottom side, and a top plurality of contact pads on the top side. A bottom solder resist layer is on the bottom side, and a top solder resist layer is on the top side. The concept of dual side solder resist is extended to packages with interconnect bridge with C4 interconnection pitch over a wide range.

25 Claims, 9 Drawing Sheets

(52) U.S. Cl.
CPC ............ *H01L 23/49816* (2013.01); *H01L 2221/68345* (2013.01); *H01L 2221/68381* (2013.01); *H01L 2224/04105* (2013.01); *H01L 2224/12105* (2013.01); *H01L 2224/1403* (2013.01); *H01L 2224/16225* (2013.01); *H01L 2224/16227* (2013.01); *H01L 2224/18* (2013.01); *H01L 2224/73267* (2013.01); *H01L 2924/15192* (2013.01); *H01L 2924/15311* (2013.01); *H01L 2924/19106* (2013.01)

(56) References Cited

U.S. PATENT DOCUMENTS

| | | | |
|---|---|---|---|
| 2005/0230835 A1* | 10/2005 | Sunohara et al. | 257/758 |
| 2006/0003495 A1 | 1/2006 | Sunohara et al. | |
| 2008/0060838 A1 | 3/2008 | Chen et al. | |
| 2009/0321932 A1 | 12/2009 | Gonzalez et al. | |
| 2010/0155939 A1 | 6/2010 | Chang et al. | |
| 2011/0005824 A1* | 1/2011 | An | H05K 3/4658 174/261 |
| 2011/0304061 A1* | 12/2011 | Ishida | H01L 24/06 257/786 |
| 2014/0117552 A1 | 5/2014 | Qian et al. | |
| 2015/0130050 A1* | 5/2015 | Lin et al. | 257/737 |

FOREIGN PATENT DOCUMENTS

| | | |
|---|---|---|
| JP | 2006-287099 A | 10/2006 |
| JP | 2008-270346 A | 11/2008 |
| JP | 2009-141121 A | 6/2009 |
| JP | 2009-141121 A | 6/2009 |
| JP | 2011-187800 A | 9/2011 |
| JP | 2011-187800 A | 9/2011 |
| JP | 2012-004399 A | 1/2012 |
| JP | 2012-004399 A | 1/2012 |
| JP | 2013-062474 A | 4/2013 |
| JP | 2014-096609 A | 5/2014 |
| KR | 10-2006-0048664 | 5/2006 |
| KR | 10-2010-0003246 | 1/2010 |
| KR | 10-2013-0096281 | 8/2013 |

OTHER PUBLICATIONS

Official Communication along with Search Report from the Taiwan Intellectual Property Office dated May 30, 2016 for Taiwan Patent Application No. 104123274.

First Official Action from the Japan Patent Office dated Jun. 21, 2016 for Japanese Patent Application Nol. 2015-142559 and English Translation thereof.

Official Action (8 pages) from the Japan Patent Office dated Nov. 22, 2016 for Japanese Patent Application No. 2015-142559 and English Translation (7 pages) thereof.

Notice of Allowance (2 pages) from the Taiwan Patent Office dated Mar. 22, 2017 for Taiwan Patent Application No. 104123274 and English Translation (1 page) thereof.

\* cited by examiner

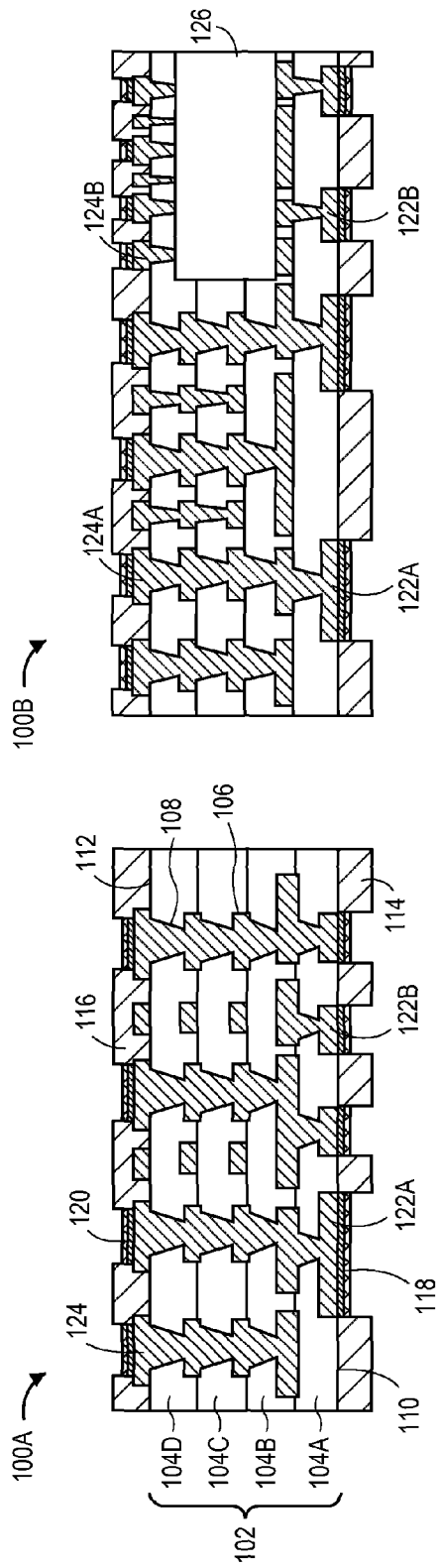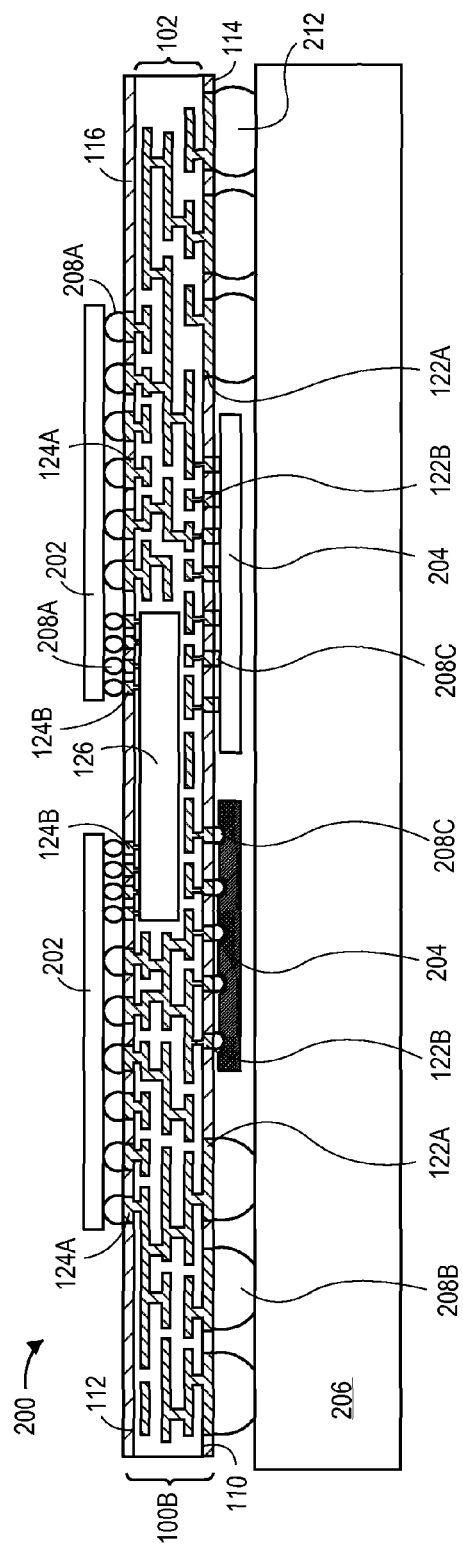
FIG. 1A
FIG. 1B
FIG. 2

DUAL SIDE SOLDER RESIST LAYERS FOR CORELESS PACKAGES AND PACKAGES WITH AN EMBEDDED INTERCONNECT BRIDGE AND THEIR METHODS OF FABRICATION

TECHNICAL FIELD

Embodiments of the present invention relate generally to package substrates. More particularly, embodiments of the present invention relate to coreless package substrates and substrate packages with widely varying C4 pitch with dual solder resist layers and their methods of fabrication.

BACKGROUND

Coreless package substrates are important components for modern electronic devices, such as integrated circuit dies. Coreless package substrates interconnect integrated circuit dies to circuit boards and help reduce overall package assembly height. Typically, integrated circuit dies mount directly to package substrates. As a result, package substrates are required to be compatible with fine contact arrangements of the integrated circuit dies. Recent technological advancement has developed package substrates that are compatible with the fine contact arrangements of integrated circuit dies.

BRIEF DESCRIPTION OF THE DRAWINGS

FIG. 1A illustrates a cross-sectional view of a coreless package substrate, in accordance with an embodiment of the invention.

FIG. 1B illustrates a cross-sectional view of a coreless package substrate having contact pads of different widths on each side of the coreless package substrate, in accordance with an embodiment of the invention.

FIG. 2 illustrates a cross-sectional view of a package assembly incorporating a coreless package substrate, in accordance with an embodiment of the invention.

DETAILED DESCRIPTION

Coreless package substrates with dual solder resist layers and their methods of fabrication are disclosed. Embodiments of the present invention are described with respect to specific details in order to provide a thorough understanding of the invention. One of ordinary skill in the art will appreciate that embodiments of the invention can be practiced without these specific details. In other instances, well known semiconductor processes are not described in specific detail in order to not unnecessarily obscure embodiments of the present invention. Additionally, the various embodiments shown in the figures are illustrative representations and are not necessarily drawn to scale.

Embodiments of the invention are directed to coreless package substrates with dual solder resist layers and their methods of fabrication. In one embodiment of the invention, the coreless package substrate includes a build-up structure and top and bottom contact pads. The top contact pads are formed on a top side of the coreless package substrate, and the bottom contact pads are formed on a bottom side of the coreless package substrate. In an embodiment, top and bottom surface finishes are formed on the top and bottom contact pads, respectively. The coreless package substrate further includes a top solder resist layer disposed on the top side, and a bottom solder resist layer disposed on the bottom side. As a result, the coreless package substrate has a layer of solder resist on both the top and bottom sides.

The top and bottom solder resist layers enhance device performance by allowing integration of active/passive device components on both sides of the coreless package substrates. Additionally, the top and bottom solder resist layers reduce occurrences of pad-to-pad bridging by minimizing formation of solder residue on both sides of the coreless package substrates. Further, the top and bottom solder resist layers allow selective tuning of surface finish plating thicknesses by enabling different surface finish thicknesses to be formed on contact pads located on the coreless package substrates.

Figure 7:
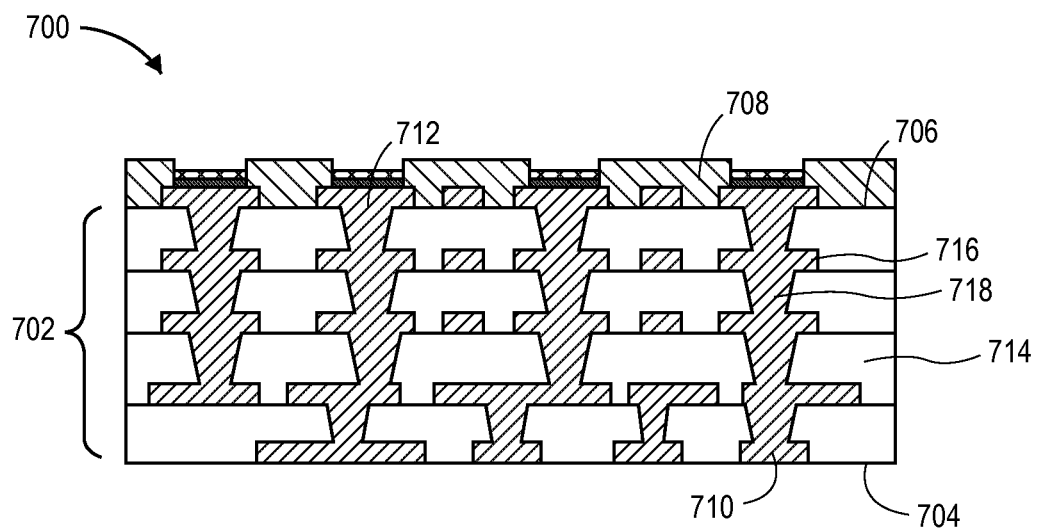
FIG. 7 illustrates a conventional coreless package substrate.

An exemplary conventional coreless package substrate is illustrated in FIG. 7. A conventional coreless package substrate 700 includes a coreless package substrate 702 and a single solder resist layer 708. The single solder resist layer 708 is disposed on a top side 706 of the coreless package substrate 702. Conventional coreless package substrates 700 do not have a solder resist layer on a bottom side 704. The solder resist layer 708 enables contact pads disposed on the top side 706 to be formed with narrow widths for coupling to fine-pitched device components. As a result, only one side of a conventional coreless package substrate 700 can be integrated with fine-pitched device components.

FIG. 1A illustrates a coreless package substrate 100A with dual solder resist layers according to embodiments of the invention. The illustration in FIG. 1A depicts a close-up view of a portion of an entire coreless package substrate 100A for clarity purposes. The coreless package substrate 100A includes a build-up structure 102 containing an alternating arrangement of insulating layers 104 and conductive layers 106. The conductive layers 106 may be electrically coupled to one another through the insulating layers 104 by vias 108. In embodiments, the build-up structure 102 does not contain a stiffening core formed of a material different from the insulating layers 104 and conductive layers 106 of the build-up structure 102.

In an embodiment, the build-up structure 102 has a top side 112 and a bottom side 110 opposite of the top side 112. The top side 112 may be a controlled collapse chip connection (C4) side of the build-up structure 102 that makes electrical connection with a device component, such as an integrated circuit die. In an embodiment, the bottom side 110 may be a second level interconnect (SLI) side of the build-up structure 102 that makes electrical connection with at least a second level interconnect, such as an interposer and a printed circuit board (PCB).

The coreless package substrate 100A further includes top contact pads 124 and bottom contact pads 122. The top contact pads 124 are disposed on the top side 112 of the build-up structure 102, and the bottom contact pads 122 are disposed on the bottom side 110 of the build-up structure 102. The top and bottom contact pads 124 and 122 may electrically couple the coreless package substrate 100A to device components and/or second level interconnects. In embodiments, the top contact pads 124 are electrically coupled to the bottom contact pads 122 by conductive layers 106 and vias 108 of the build-up structure 102.

In embodiments, surface finishes are disposed on exposed surfaces of the top and bottom contact pads 124 and 122. The surface finishes may passivate exposed surfaces of the contact pads to prevent oxidation of the contact pads. In an embodiment, a top surface finish 120 may be disposed on the top contact pads 124, and a bottom surface finish 118 may be disposed on the bottom contact pads 122. In embodiments, the top and bottom surface finishes 120 and 118 are formed of a conductive material that does not substantially interfere with electrical signals flowing into and out of the top and bottom contact pads 124 and 122, respectively. For instance, the surface finishes 120 and 118 may be formed of a metal, such as nickel (Ni), palladium (Pd), gold (Au), silver (Ag), and combinations thereof. In an embodiment, the surface finishes 120 and 118 are formed of a layer of Ni and a layer of PdAu on top of the layer of Ni.

According to embodiments of the invention, the coreless package substrate 100A further includes a top solder resist layer 116 and a bottom solder resist layer 114. In an embodiment, the top solder resist layer 116 is disposed on the top side 112, and the bottom solder resist layer 114 is disposed on the bottom side 110. The solder resist layers 116 and 114 may prevent pad-to-pad bridging by repelling solder-based materials and prohibiting residue from remaining on the solder resist surface during formation of interconnect structures (e.g., solder bumps). Prohibiting formation of solder residue allows narrower contact pads to be formed for electrical coupling to active/passive components with fine-pitched contact arrangements. Narrow contact pads enable formation of contact arrangements with fine pitches. As a result, the top and bottom solder resist layers 116 and 114 may allow fine-pitched contact arrangements to be formed on both the top and bottom sides 112 and 110, respectively.

For example, as depicted in FIG. 1A, the bottom contact pads 122 may include wide contact pads 122A and narrow contact pads 122B. The wide contact pads 122A may be formed with a contact pitch suitable for interconnection with SLI structures having wide contact pitches, such as a PCB or an interposer. The narrow contact pads 122B may be formed with a contact pitch suitable for interconnection with device components, such as an integrated circuit die. Pitch requirements may substantially dictate the limits of pad widths. Accordingly, the widths of the wide and narrow pads 122A and 122B may vary according to pitch requirements. In an embodiment, the width of the wide pads 122A is at least 3 times wider than the width of the narrow pads 122B. In an embodiment, the width of the wide pads 122A ranges from 300 to 400 μm and the width of the narrow pads 122B ranges from 80 to 100 μm. In an embodiment, the pitch of the wide pads 122A ranges from 600 to 800 μm and the pitch of the narrow pads 122B ranges from 160 to 200 μm.

The top contact pads 124 may also include wide contact pads 124A and narrow contact pads 124B as shown in an exemplary coreless package substrate 100B in FIG. 1B. The illustration in FIG. 1B depicts a close-up view of a portion of an entire coreless package substrate 100B for clarity purposes. The wide contact pads 124A may have a width and a contact pitch suitable for coupling to device components, such as integrated circuit dies. In an embodiment, the contact pitch of the wide contact pads 124A corresponds with the standard central processing unit (CPU) bump pitch. For example, in an embodiment, the wide contact pads 124A a pitch in the range of 120 to 130 μm and a corresponding width in the range of 80 to 90 μm.

The coreless package substrate 100B may include an embedded device 126 within the build-up structure 102. The embedded device 126 may be an embedded interconnect bridge formed of a silicon, an organic, or a glass material. Embedding a silicon bridge within the build-up structure 102 may enable the coreless package substrate 100B to be suitable for high bandwidth applications. In an embodiment, the embedded device 126 interconnects a CPU to a fine-pitched device, such as a memory chip. The narrow contact pads 124B may have a pitch that corresponds with the fine contact pitch requirement of the memory chip. In an embodiment, the narrow contact pads 124B have a width in the range of 30 to 40 μm and a pitch in the range of 50 to 60 μm.

Although FIG. 1B illustrates an embedded device 126 within a coreless package substrate 100B, embodiments of the present invention are applicable to cored package substrates as well. For instance, embodiments of the present invention are applicable to a cored package substrate with an embedded device 126 having wide and narrow contact pads 124A and 124B on the top side 112 and wide and narrow contact pads 122A and 122B on the bottom side 110. The top and bottom solder resist layers 116 and 114 are formed on the top and bottom sides 112 and 110, respectively. The cored package substrate includes a stiffening core disposed within the build-up structure 102.

It is to be appreciated that although FIGS. 1A and 1B illustrate contact pads with two different widths on each side of the coreless package substrate, embodiments are not so limited. For instance, the first and/or second of pads 122, 124 may include three or more sets of contact pads where each set has a different width. Each set may include one or more contact pads that are arranged to correspond with a specific contact pitch.

FIG. 2 illustrates a package assembly 200 including the coreless package substrate 100B according to embodiments of the invention. The coreless package substrate 100B includes the build-up structure 102 and the top and bottom solder resist layers 116 and 114. In an embodiment, device components 202 are coupled to the top side 112 of the coreless package substrate 100B. The top contact pads 124 may electrically couple to the device components 202 by interconnects 208A. The device components 202 may be an integrated circuit die, a CPU, a memory chip, and/or a graphics processor. In an embodiment, at least one device component 202 is an integrated circuit die that is flip-chip bonded to the coreless package substrate 100B. The embedded device 126 may be included in the build-up structure 102 of the coreless package substrate 100B. In an embodiment, the device components 202 are electrically coupled to the embedded device 126 by the narrow contact pads 124B. In an embodiment, the top solder resist layer 116 is disposed between the device components 202 and the build-up structure 102. In an embodiment, the top solder resist layer 116 is disposed within an entire die shadow region (i.e., the regions directly underneath) of each device component 202.

In an embodiment, an SLI structure 206 is coupled to the bottom side 110 of the coreless package substrate 100B. The SLI structure 206 may be any suitable structure such as, but not limited to, an interposer or a circuit board. The wide contact pads 122A of the coreless package substrate 100B may electrically couple to the SLI structure 206 by interconnects 208B. According to embodiments of the invention, active/passive device components 204 are also coupled to the bottom side 110 of the coreless package substrate 100B. The narrow contact pads 122B of the coreless package substrate 100B may electrically couple to the active/passive device components 204 by the interconnects 208C. In an embodiment, the bottom solder resist layer 114 is disposed between the active/passive device components 204 and the build-up structure 102. The bottom solder resist layer 114 may be disposed within an entire die shadow region of each active/passive device component 204. The interconnects 208A-208C may be any suitable interconnect structure formed of any suitable interconnect material. In an embodiment, the interconnects 208A-208C are solder bumps.

Figure 3A:
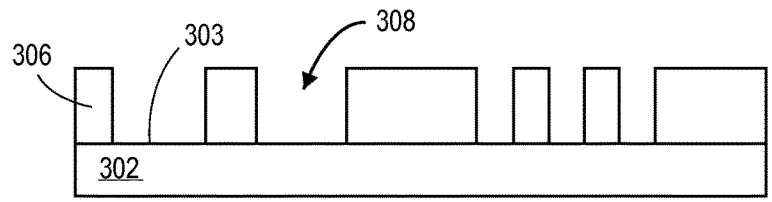
FIGS. 3A-3I illustrate cross-sectional views of a method of forming a coreless package substrate by forming a bottom solder resist layer before removing a temporary substrate, in accordance with an embodiment of the invention.

FIGS. 3A-3I illustrate a method of forming a coreless package substrate by forming a bottom solder resist layer before removing a temporary substrate, in accordance with an embodiment of the invention. In FIG. 3A, a patterned dry film resist (DFR) layer 306 is initially formed on a temporary substrate 302. In an embodiment, the temporary substrate 302 is a rigid carrier substrate. The temporary substrate 302 provides a rigid base upon which structures may form. In an embodiment, the temporary substrate 302 is a panel containing multiple package substrates. For instance, the temporary substrate 302 may be a panel containing an N×N array of package substrates. The temporary substrate 302 may be formed of any well-known stiffening core. For example, the temporary substrate 302 may be formed of a reinforced insulating layer disposed between a pair of release layers and a pair of metal foil layers on top of the release layers.

In embodiments, the patterned DFR layer 306 exposes portions of a top surface 303 of the temporary substrate 302. The exposed portions of the top surface 303 allow structures to form on the temporary substrate 302. The patterned DFR layer 306 may be formed by first laminating a layer of DFR on the temporary substrate 302 and subsequently patterning the DFR layer to form openings 308. In an embodiment, the openings 308 are formed by any conventional exposure and developer process where exposure to electromagnetic radiation cross-links the DFR film and a developer removes unexposed regions of the DFR film.

Figure 3B:
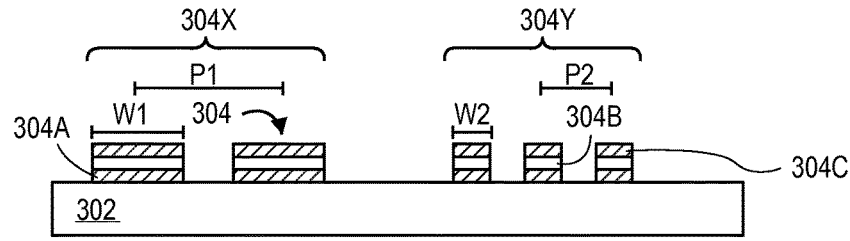

Next, in FIG. 3B, multi-layered structures 304 are formed on the temporary substrate 302 within the openings 308. In an embodiment, each multi-layered structure 304 is formed of three layers: a bottom layer 304A, a middle layer 304B, and a top layer 304C. In embodiments, the top layer 304C of each multi-layered structure 304 is later used to form the bottom contact pads 122. In an embodiment, the top layer 304C is formed of a conductive material designed for use as the bottom contact pads 122. For example, the top layer 304C may be formed of a metal, such as copper. In an embodiment, the bottom layer 304A is formed of a same material as the metal foil in the temporary substrate 302. For example, the bottom layer 304A may be formed of copper. In an embodiment, the bottom layer 304A and the top layer 304C are formed of the same conductive material. In a particular embodiment, the bottom layer 304A and the top layer 304C are formed of copper. In embodiments, the middle layer 304B is disposed between the bottom and top layers 304A and 304C. The middle layer 304B may be formed of a material different from the bottom and top layers 304A and 304C. In an embodiment, the middle layer 304B is formed of a material that can be selectively removed relative to the first and third layers 304A and 304C. For instance, the middle layer 304B may be formed of nickel.

The multi-layered structures 304 may be formed by a series of any suitable deposition techniques, such as chemical vapor deposition (CVD) or physical vapor deposition (PVD). In an embodiment, the multi-layered structures 304 are formed by initially depositing the first layer 304A on top of the temporary substrate 302 as well as the patterned DFR layer 306. Next, the second layer 304B is deposited on top of the first layer 304A. Thereafter, the third layer 304C is deposited on top of the second layer 304B. Once all three layers are deposited, then the DFR layer 306 is removed, along with portions of the first, second, and third layers 304A, 304B, and 304C disposed on top of the DFR layer 306. As such, the multi-layered structures 304 remain on the temporary substrate 302 as illustrated in FIG. 3B.

Each multi-layered structure 304 may be designed to have a certain width and pitch. In embodiments, the widths of the multi-layered structures 304 define the width of the bottom contact pads 122. The pitch of the multi-layered structures 304 may also define the pitch of the bottom contact pads 122. Accordingly, the pitch of the multi-layered structure 304 may be designed to be compatible with contact pitches of a circuit board or a device component. Therefore, each multi-layered structure 304 may be designed to have wide or narrow widths as shown in FIG. 3B.

In FIG. 3B, the multi-layered structures 304 include wide multi-layered structures 304X and narrow multi-layered structures 304Y. In an embodiment, the wide multi-layered structures 304X are formed to have a width W1 and a pitch P1. The width W1 and pitch P1 may correspond with contact arrangements of an SLI structure such as a PCB. Accordingly, in an embodiment, the wide multi-layered structures 304X have a width W1 in the range of 300 to 400 µm and a pitch P1 in the range of 600-800 µm. According to embodiments of the invention, the narrow multi-layered structures 304Y may be formed to have a width W2 corresponding to fine-pitches of active/passive device components, such as memory chips or magnetic inducers. Such device components may require contact pitches that are significantly narrower than the contact pitch of circuit boards. In an embodiment, each narrow multi-layered structure 304Y has a width W2 that is at least 3 times narrower than each wide multi-layered structure 304X. In a particular embodiment, each narrow multi-layered structure 304Y has a width W2 in the range of 80 to 100 µm and a pitch P2 in the range of 160 to 200 µm.

Figure 3C:
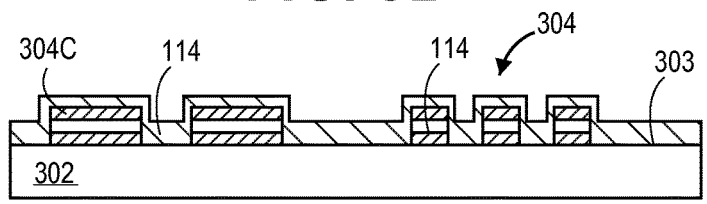

In FIG. 3C, a bottom solder resist layer 114 is then formed on exposed surfaces of the temporary core 302 and the multi-layered structures 304 by any suitable lamination technique, such as, but not limited to, silk-screening, spraying, or vacuum laminating. In an embodiment, the bottom solder resist layer 114 completely covers the exposed surfaces of the temporary core 302 and the multi-layered structures 304. In an embodiment, the bottom solder resist layer 114 is formed to a thickness sufficient to substantially electrically isolate each pad of the bottom contact pads 122. For example, the bottom solder resist layer 114 is formed to a thickness in the range of 25 to 45 µm. The bottom solder resist layer 114 may be formed of an insulating material that has poor wettability to paste materials, i.e., repels, or does not bond with paste materials, such as solder paste. In an embodiment, the bottom solder resist layer 114 is formed of a polymer. In an embodiment, the bottom solder resist layer 114 is formed of a polymer, such as an epoxy resin. Further, in an embodiment, the bottom solder resist layer 114 is formed as a photosensitive layer such that the bottom solder resist layer 114 may be patterned by optical lithography. In such an embodiment, the bottom solder resist layer 114 is formed of a material containing a photoactive package. In a particular embodiment, the bottom solder resist layer 114 is formed of liquid photoimageable solder mask (LPSM) or dry film photoimageable solder mask (DFSM).

Figure 3D:
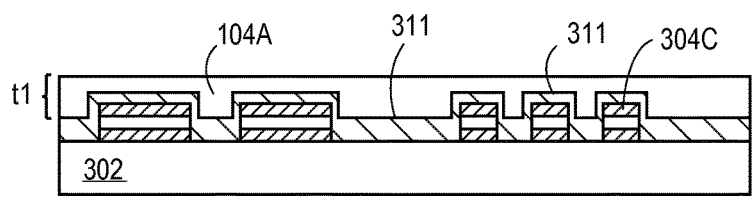

Next, in FIG. 3D, a bottommost insulating layer 104A is deposited on the bottom solder resist layer 114, thereby beginning formation of the build-up structure 102. The bottommost insulating layer 104A may be formed by any suitable lamination technique, such as vacuum lamination. In an embodiment, the bottommost insulating layer 104A does not make contact with the top layer 304C of the stacked structures 304. The bottommost insulating layer 104A may be formed to have a thickness t1 sufficient to substantially prevent electrical interference between structures above and below the bottommost insulating layer 104A. In an embodiment, the bottommost insulating layer 104A may have a thickness t1 ranging from 35 to 55 μm. In an embodiment, the bottommost insulating layer 104A is formed of an epoxy-based resin with a silica filler to provide suitable mechanical properties that meet reliability requirements of the coreless package substrate. In a particular embodiment, the bottommost insulating layer 104A is formed of Ajinomoto Build-up Film (ABF).

Figure 3E:
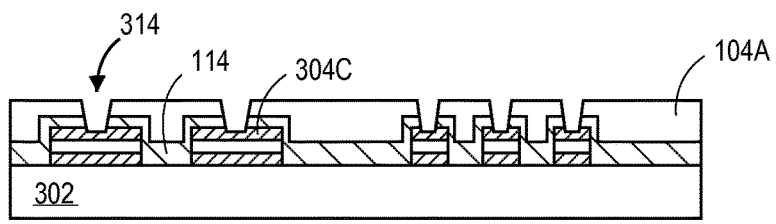

Thereafter, in FIG. 3E, openings 314 may be formed in the bottommost insulating layer 104A and the bottom solder resist layer 114 to expose the top layer 304C of each multi-layered structure 304. The openings 314 may be formed by any suitable etching technique, such as laser ablation. In an embodiment, forming the openings 314 by laser ablation removes a portion of the top layer 304C as shown in FIG. 3E. Each opening 314 allows a conductive structure, such as a via 108 as depicted in FIG. 3F, to connect to the top layer 304C.

Figure 3F:
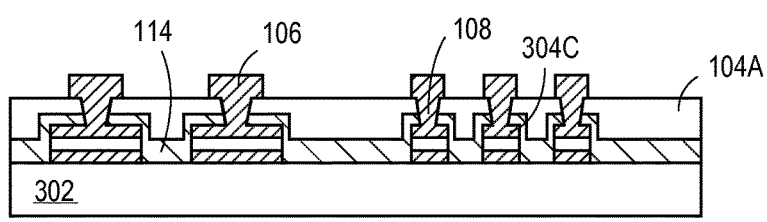

Next, in FIG. 3F, the via 108 and a conductive layer 106 is formed. To form the via 108 and the conductive layer 106, a DFR layer may be initially patterned on top of the bottommost insulating layer 104A. The patterned DFR layer may define the lateral boundaries of the conductive layer 106. Thereafter, a conductive material may be deposited in the opening 314 and between the DFR layers with a single deposition process. In an embodiment, conductive material is deposited by electroless plating. Once the conductive material is deposited, the DFR layer is removed. The remaining conductive material disposed between the DFR layer and within the openings 314 may form the vias 108 and conductive layers 106.

Figure 3G:
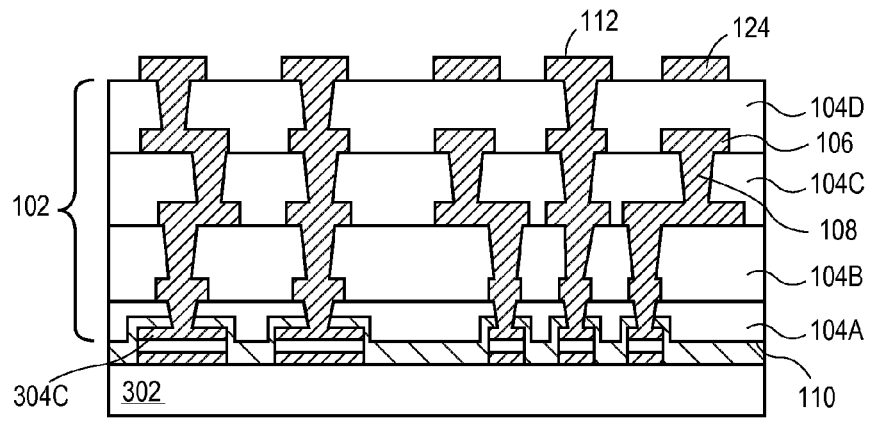

The via 108 may be formed within the opening 314 such that the top layer 304C of each multi-layered structure 304 is electrically coupled to the conductive layer 106. The conductive layer 106 may be one of several redistribution layers for routing current through the build-up structure 102 as shown in FIG. 3G. The conductive layer 106 and via 108 may be formed of any conductive material, such as a metal. In an exemplary embodiment, the conductive layer 106 and via 108 are formed of copper.

The steps described in FIGS. 3D-3F above illustrate a semi-additive process (SAP). The SAP may be repeated several times to form the build-up structure 102 shown at least in FIG. 3G. The build-up structure 102 illustrated in FIG. 3G is formed of four SAPs. However, alternative embodiments may use more or less iterations of SAPs to form the build-up structure 102 for a coreless package substrate according to embodiments of the invention. Although FIG. 3G does not illustrate an embedded device (e.g., 126 in FIG. 1B) within the build-up structure 102, embodiments where an embedded device is formed within the build-up structure 102 are contemplated. The embedded device 126 may be formed within the build-up structure 102 before or after any SAP iteration. In embodiments, the build-up structure 102 does not contain a stiffening core.

The build-up structure 102 has a top side 112 and a bottom side 110. The conductive layers 106 may be redistribution layers that allow various interconnections between the top contact pads 124 and the bottom contact pads 122 (i.e., the top layers 304C of the multi-layered structures 304). In an embodiment, the build-up structure 102 only includes materials used for the sole purpose of forming the build-up structure. For instance, the build-up structure 102 may include materials for barrier layers, seed layers, and any other similar materials used to form the insulating layers 104, conductive layers 106, and vias 108. Other materials used for purposes of stiffening the build-up structure 102 are not included in the build-up structure 102. For instance, a stiffening structure formed of a pre-preg reinforced with glass fibers, or any other suitable stiffening material, are not included in the build-up structure 102. In an embodiment, the build-up structure 102 is completely formed of only two materials: the material used to form the insulating layers 104 and the material used to form the conductive layers 106 and vias 108. Accordingly, in a specific embodiment, the build-up structure 102 contains only ABF and copper.

In embodiments, a last SAP forms the top contact pads 124. The top contact pads 124 may be disposed on top of the topmost insulating layer 104D such that the top contact pads 124 are entirely above the topmost insulating layer 104D. The top contact pads 124 are coupled to the vias 108 and the conductive layers 106 so that current may flow into and out of the top contact pads 124. In embodiments, the top side 112 of the build-up structure 102 makes electrical connection with device components. As such, the top contact pads 124 may be designed to have a width and a pitch compatible with fine contact pitches of device components. For example, the top contact pads 124 may have a width between 80 to 90 μm and a pitch between 120 to 130 μm. Although shown with only one top contact width and pitch, the top contact pads 124 may include wide and narrow contact pads as discussed in FIG. 1B. For instance, the top contact pads 124 may have narrow pads with a width in the range of 30 to 40 μm and a pitch in the range of 50 to 60 μm. The top contact pads 124 may be formed of any suitable conductive material. In an embodiment, the top contact pads 124 are formed of a metal, such as copper.

Figure 3H:
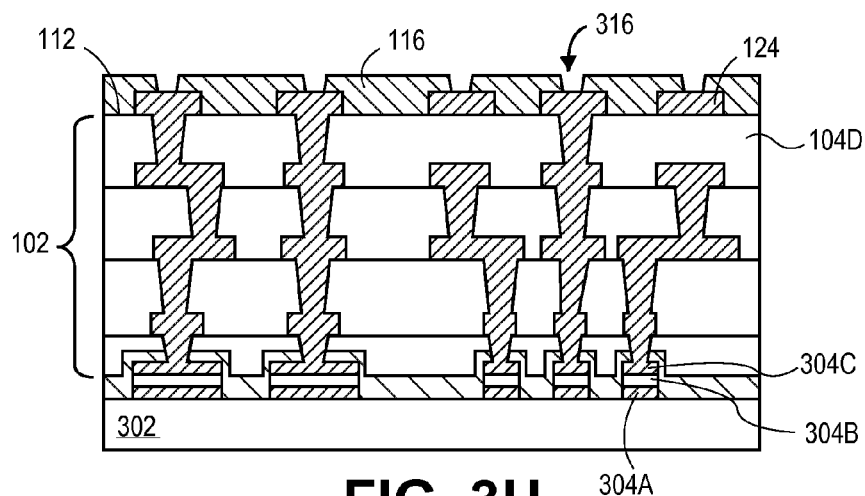

Next, in FIG. 3H, a top solder resist layer 116 is formed on the top side 112 of the build-up structure 102. Formation of the top solder resist layer 116 may be according to the same material, technique, and thickness as the bottom solder resist layer 114. In an embodiment, the top solder resist layer 116 is initially formed on exposed surfaces of the topmost insulating layer 104D and the top contact pads 124. Openings 316 are subsequently formed in the top solder resist layer 116 to expose the top contact pads 124 by any suitable exposure and develop technique well known in the art. The openings 316 allow interconnect structures, such as solder bumps, to be formed within the openings 316. As such, the interconnect structures may allow the top contact pads 124 to be coupled to device components, such as device components 202 in FIG. 2. Remaining portions of the top solder resist layer 116 may electrically isolate each contact pad of the top contact pads 124 and may resist formation of solder residue between each contact pad of the top contact pads 124.

Figure 3I:
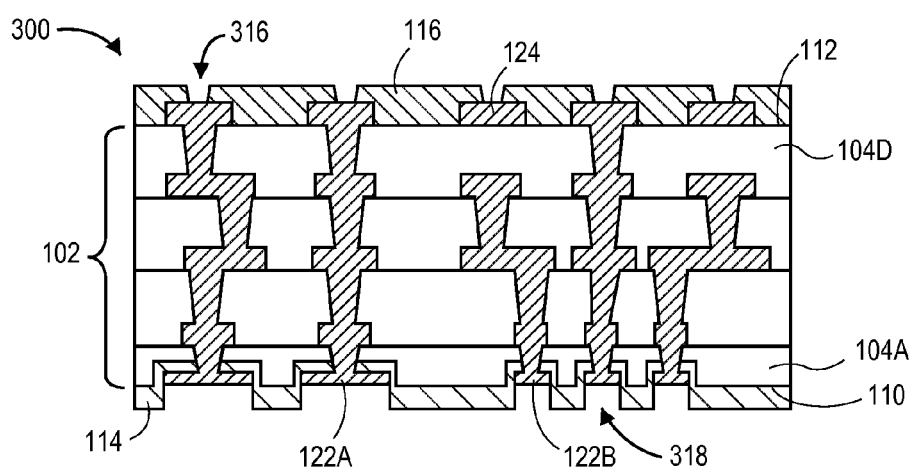

Next, in FIG. 3I, the temporary substrate 302 shown in FIG. 3H, as well as the first and second layers 304A and 304B of the multi-layered structures 304, are removed, thereby forming a coreless package substrate 300 with dual solder resist layers according to an embodiment of the invention. In an embodiment, the temporary substrate 302 is removed by selectively etching the release layer relative to the metal foil and the reinforced insulating layer of the temporary substrate 302. Next, the metal foil is removed along with the first layer 304A of the multi-layered structure 304. In an embodiment, the metal foil and the first layer 304A are made of the same material, such as copper. As such, the metal foil and the first layer 304A may be removed by an etchant selective to copper. In an embodiment, the second layer 304B prevents further etching by the etchant. Accordingly, in an embodiment, the second layer 304B is an etch stop layer. The second layer 304B may be formed of nickel. Thereafter, the second layer 304B is selectively removed relative to the third layer 304C and the bottom solder resist layer 114. As a result, the third layer 304C may remain as the bottom contact pads 122 at a bottom of pockets 318. The pockets 318 may allow interconnect structures, such as solder bumps, to electrically couple to the bottom contact pads 122. The interconnect structures may couple the bottom contact pads 122 to device components and/or circuit boards.

As shown in FIG. 3I, the coreless package substrate 300 includes the build-up structure 102, the bottom solder resist layer 114, and the top solder resist layer 116. In an embodiment, a portion of the bottom solder resist layer 114 is disposed between each contact pad of the bottom contact pads 122 and the bottommost insulating layer 104A. The bottom solder resist layer 114 may be disposed an entire distance between the bottom contact pads 122 and the bottommost insulating layer 104A. In an embodiment, the bottommost insulating layer 104A does not make contact with the bottom contact pads 122. The bottom solder resist layer 114 may be disposed on sidewalls of the bottom plurality of pads 122. Furthermore, the bottom solder resist layer 114 may also be disposed on the internal surfaces of the bottom contact pads 122. In an embodiment, the bottom solder resist layer 114 is not formed on the external surface of the bottom contact pads 122.

FIGS. 4A-4H illustrate a method of forming a coreless package substrate by forming a bottom solder resist layer after removing a temporary substrate, in accordance with an embodiment of the invention. Techniques and materials used to form the coreless package substrate in FIGS. 4A-4H are similar to those discussed above in FIGS. 3A-3I. As such, the techniques and materials are not as thoroughly described in the discussion of the method illustrated in FIGS. 4A-4H. If desired, the details of such materials and techniques may be referenced from the discussion of FIGS. 3A-3I.

Figure 4A:
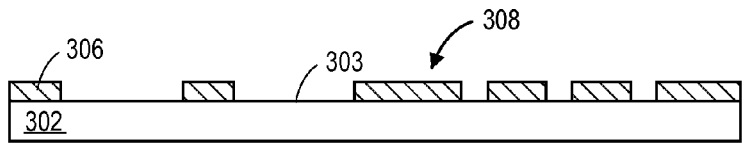
FIGS. 4A-4H illustrate cross-sectional views of a method of forming a coreless package substrate by forming a bottom solder resist layer after removing a temporary substrate, in accordance with an embodiment of the invention.
Figure 4B:
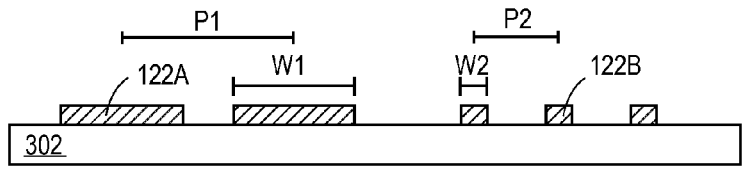

In FIG. 4A, a patterned DFR layer 306 is formed on a temporary substrate 302. The patterned DFR layer 306 exposes portions of a top surface 303 of the temporary substrate 302. The exposed portions of the top surface 303 allow structures to form on the temporary substrate 302. Next, as shown in FIG. 4B, bottom contact pads 122 are formed on the exposed portions of the temporary substrate 302. Each contact pad 122 may be designed to have a width according to contact pitches of a circuit board or a device component. In an embodiment, the bottom contact pads 122 includes wide contact pads 122A and narrow contact pads 122B. The wide contact pads 122A may be formed to have a width W1 corresponding to wide contact pitches of a circuit board, such as a PCB. Accordingly, in an embodiment, each wide contact pad 122A has a width W1 in the range of 300 to 400 µm. According to embodiments of the invention, the narrow contact pads 122B may be formed to have a width W2 compatible with active/passive device components, such as memory chips or magnetic inducers. In an embodiment, each narrow contact pad 122B has a width W2 that is at least 5 times smaller than each wide contact pad 122A. In a particular embodiment, each narrow contact pad 122B has a width W2 in the range of 40 to 60 µm.

Figure 4C:
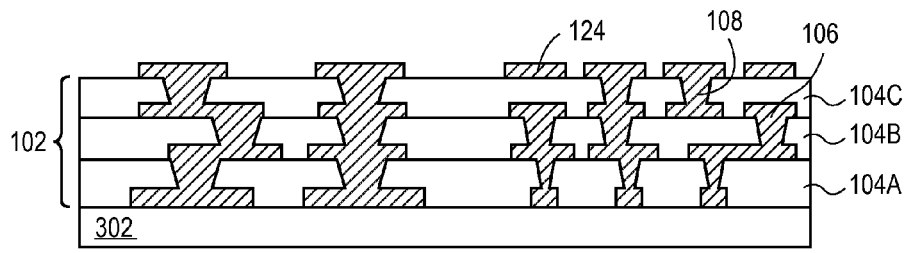

Next, the build-up structure 102 is formed by iterative SAPs as shown in FIG. 4C. The build-up structure 102 is formed of vias 108, conductive layers 106, and insulating layers 104A, 104B, and 104C. A top and bottom contact pads 124 and 122 may be formed on a top and bottom side 112 and 110 of the build-up structure, respectfully. The top contact pads 124 may be formed on a top surface of a topmost insulating layer 104C.

Figure 4D:
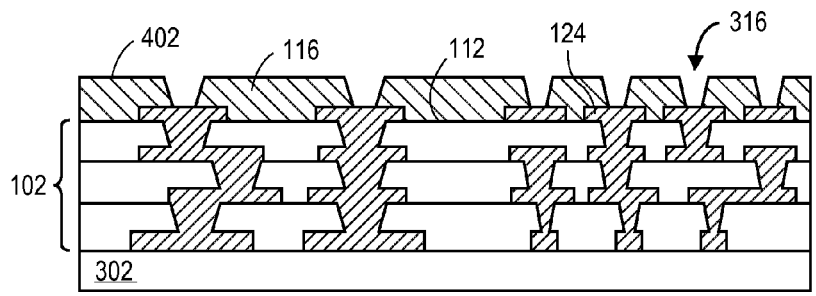

Thereafter, in FIG. 4D, a top solder resist layer 116 is laminated on a top side 112 of the build-up structure 102. The top solder resist layer 116 has a top surface 402. Openings 316 are subsequently formed in the top solder resist layer 116 to expose the top contact pads 124. In an embodiment, the openings 316 allow interconnect structures, such as solder bumps, to be formed in the openings 316. The interconnect structures may electrically couple the top contact pads 124 to device components, such as device components 202 in FIG. 2. The top solder resist layer 116 may prevent bridging between the contact pads 124 by repelling solder-based materials during formation of the interconnect structures.

Figure 4E:
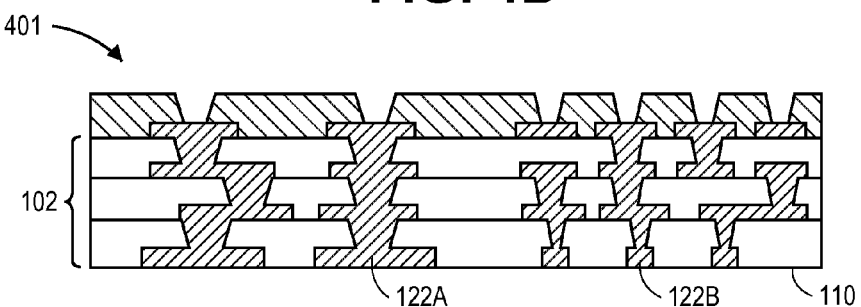
Figure 4F:
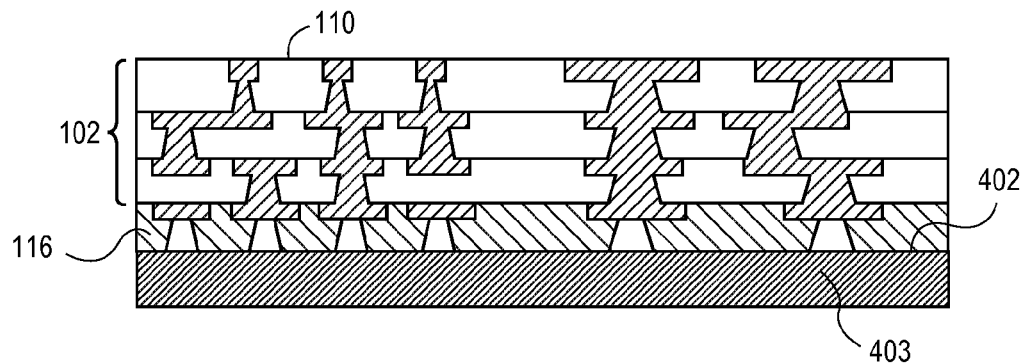

Next, in FIG. 4E, the temporary substrate 302 is removed from the build-up structure 102 to expose the bottom side 110 and the bottom contact pads 122 of the build-up structure 102. In an embodiment where the temporary substrate 302 is a panel of an N×N array of packages, the build-up structure 102 is de-paneled from the temporary substrate 302. Once the temporary substrate 302 is removed, the remaining structure 401 may be extremely pliable due to a lack of a stiffening structure (i.e., the temporary substrate 302). For subsequent processing to occur, the remaining structure 401 needs to be placed on a stiff structure. For instance, as shown in FIG. 4F, the build-up structure 102 may be inverted and planarized by a planarization structure 403. In an embodiment, the top surface 402 of the top solder resist layer 116 is placed upon the planarization structure 403 to expose the bottom side 110 of the build-up structure 102 upward. The planarization structure 403 substantially planarizes the build-up structure 102 and provides a rigid base for further processing. In an embodiment, the planarization structure 403 is a vacuum fixture. The planarization structure 403 may draw the build-up structure 102 into a planarized position with suction force applied by the planarization structure 403.

Figure 4G:
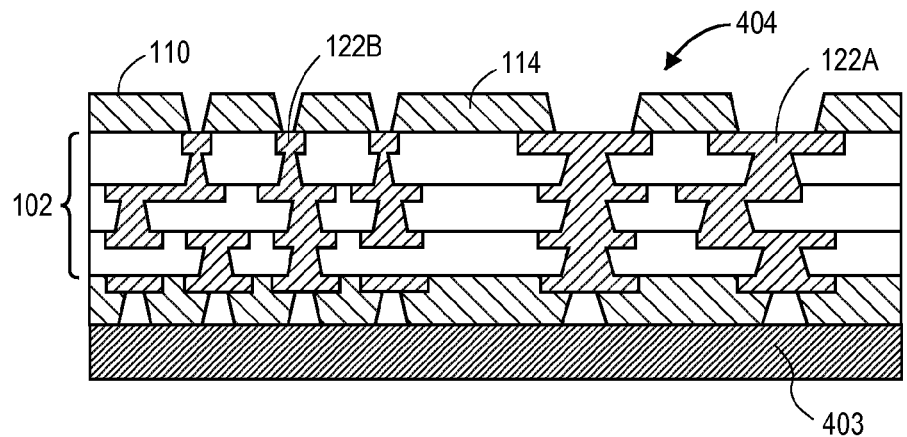

In FIG. 4G, the bottom solder resist layer 114 is then laminated on the bottom side 110 of the build-up structure 102, and openings 404 are subsequently formed in the bottom solder resist layer 114 to expose the bottom contact pads 122. In an embodiment, the openings 404 allow interconnect structures, such as solder bumps, to be formed within the openings 404. The interconnect structures may electrically couple the bottom contact pads 122 to device components (e.g., active/passive device components 204 in FIG. 2) and/or a circuit board (e.g., SLI structure 206 in FIG. 2).

Figure 4H:
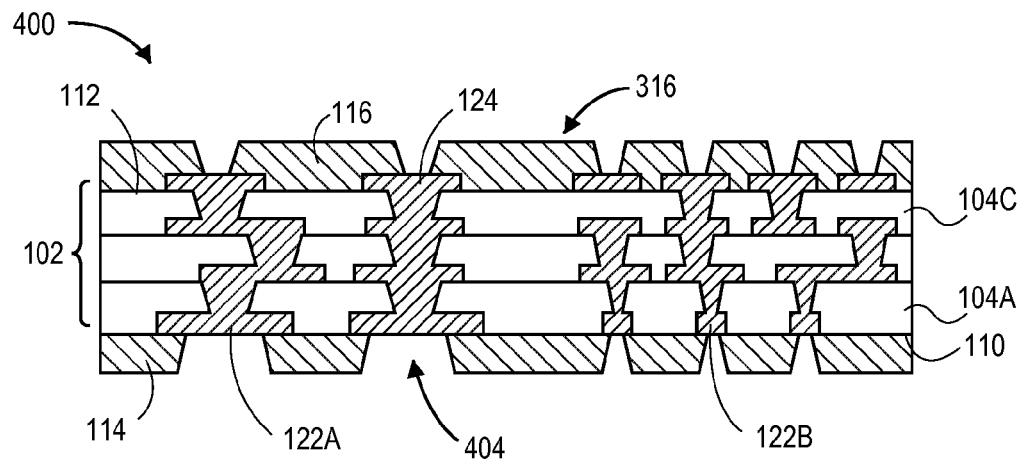

Thereafter, in FIG. 4H, the build-up structure 102 is removed from the planarization structure 403 to form the coreless package substrate 400, according to an embodiment of the invention. The coreless package substrate 400 may now be implemented in a package assembly. As illustrated in FIG. 4H, the coreless package substrate 400 has been inverted back to its orientation before being placed on the planarization structure 403. In embodiments, each contact pad of the bottom contact pads 122 does not extend above the bottommost insulating layer 104A. In an embodiment, a portion of the bottom solder resist layer 114 is on top of a portion of the bottom contacts 122. In an embodiment, a portion of the top solder resist layer 116 is disposed directly laterally adjacent to each contact pad of the top contact pads 124. Additionally, in an embodiment, no portion of the bottom solder resist layer 114 is disposed directly laterally adjacent to each contact pad of the bottom contact pads 122. The top and bottom solder resist layers 116 and 114 prevent bridging between two adjacent contact pads of the top and bottom contact pads 124 and 122, respectively, from solder paste residue. Accordingly, the solder resist layers 114 and 116 allow narrow contact pads to be formed on both sides of the coreless package substrate to couple with fine-pitched device components.

FIGS. 5A-5G illustrate a method of forming surface finishes on contact pads located on both sides of a coreless package substrate, in accordance with an embodiment of the invention. Having solder resist layers on both sides of a coreless package substrate allows a surface finish on the bottom side of the coreless package substrate to have a different thickness than a surface finish on the top side of the coreless package substrate.

Figure 5A:
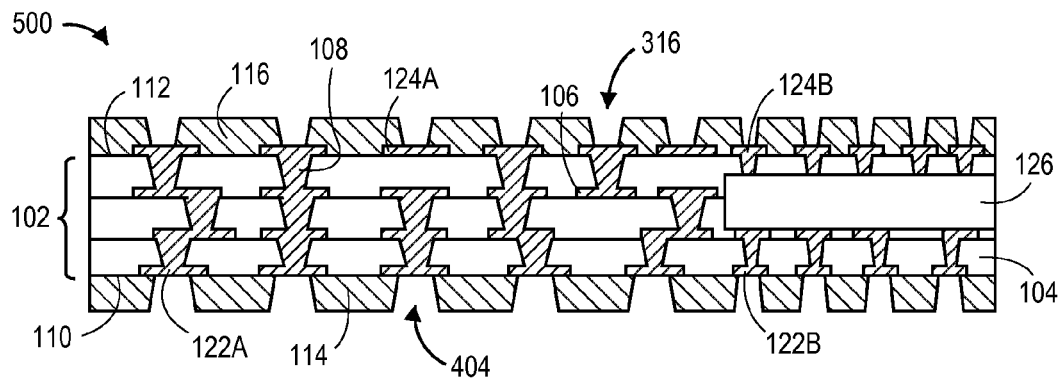
FIGS. 5A-5G illustrate cross-sectional views of a method of forming a thick surface finish on contact pads of a coreless package substrate having an embedded silicon bridge, in accordance with an embodiment of the invention.

In FIG. 5A, a coreless package substrate 500 is provided. The package substrate 500 may be formed by either method described above in FIGS. 3A-3I and FIGS. 4A-4H, but is shown as being formed by the method described in FIGS. 4A-4H. The coreless package substrate 500 includes a build-up structure 102 and a top and bottom contact pads 124 and 122. The top contact pads 124 are disposed on a top side 112 of the build-up structure 102, and the bottom contact pads 122 are disposed on a bottom side 110 of the build-up structure 102. In an embodiment, the top contact pads 124 includes wide contact pads 124A and narrow contact pads 122B, and the bottom contact pads 122 includes wide contact pads 122A and narrow contact pads 122B. The narrow contact pads 124B of the top contact pads 124 may be electrically coupled to an embedded device 126 located within the build-up structure 102. A top solder resist layer 116 is disposed on the top side 112 of the build-up structure 102, and a bottom solder resist layer 114 is disposed on the bottom side 110 of the build-up structure 102.

Figure 5B:
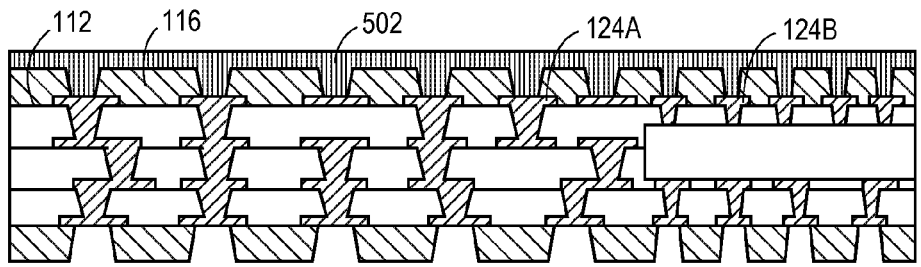

Next, in FIG. 5B, one side of the coreless package substrate 500 is covered with a temporary protective layer 502. In the embodiment depicted in FIG. 5B, the top side 112 is covered with the temporary protective layer 502. The temporary protective layer 502 may cover all exposed surfaces of structures on the top side 112 to expose structures only on the bottom side 110. The temporary protective layer 502 may prevent deposition of a surface finish on the top contact pads 124. In an embodiment, the temporary protective layer 502 is formed of any suitable insulating material resistant to chemical reactions during deposition of a surface finish. In a particular embodiment, the temporary protective layer 502 is formed of polyethylene terephthalate (PET).

Figure 5C:
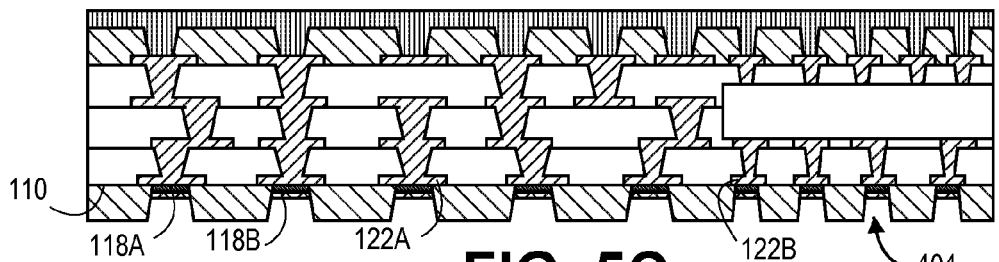

Thereafter, in FIG. 5C, a bottom surface finish 118 is formed on exposed surfaces of the bottom contact pads 122. The bottom surface finish 118 passivates the bottom contact pads 122 to prevent oxidation of the bottom contact pads 122. In an embodiment, the bottom surface finish 118 is formed of two layers: a first bottom surface finish 118A and a second bottom surface finish 118B. In an embodiment, the first bottom surface finish 118A is formed on the bottom contact pads 122, and the second bottom surface finish 118B is formed on the first bottom surface finish 118A. The first and second bottom surface finishes 118A and 118B may be formed by any suitable deposition technique, such as electroless plating. In an embodiment, the first bottom surface finish 118A is formed to a thickness sufficient to adhere the second bottom surface finish 118B to the bottom contact pads 122. In a particular embodiment, the first bottom surface finish 118A is formed to a thickness ranging from 6 to 8 μm. In an embodiment, the second bottom surface finish 118B is formed to a thickness sufficient to prevent oxidation of the first bottom surface finish 118A. In a particular embodiment, the second bottom surface finish 118B is formed to a thickness ranging from 2 to 4 μm. In an embodiment, the first and second bottom surface finishes 118A and 118B are formed of a conductive material, such as a metal containing nickel (Ni), palladium (Pd), gold (Au), silver (Ag), and combinations thereof. In a particular embodiment, the first bottom surface finish 118A is formed of Ni, and the second bottom surface finish 118B is formed of PdAu.

Figure 5D:
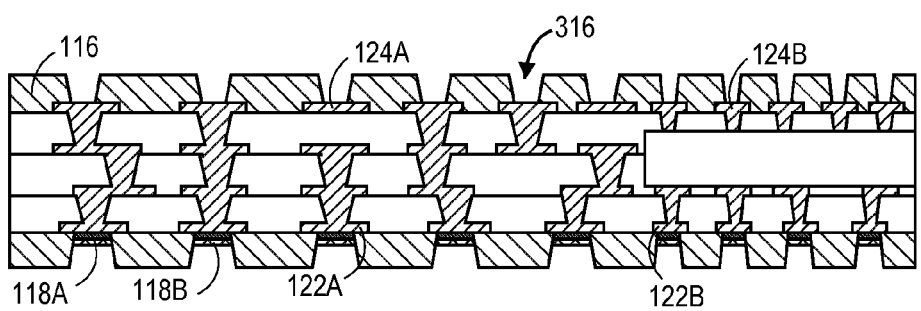

After the bottom surface finish 118 is formed, the temporary protective layer 502 is removed, as illustrated in FIG. 5D. Removing the temporary protective layer 502 exposes the top solder resist layer 116 as well as portions of the top contact pads 124. In embodiments, the bottom surface finish 118 remains on the bottom contact pads 122.

Figure 5E:
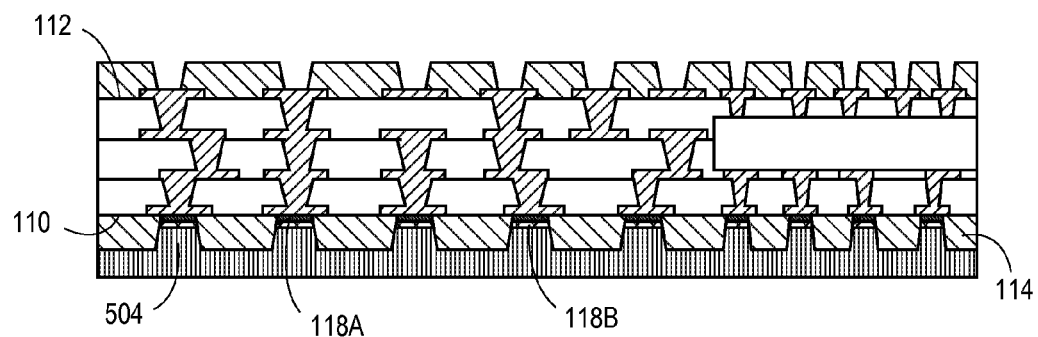

Next, in FIG. 5E, a temporary protective layer 504 is formed on the bottom side 110 to cover exposed surfaces of the bottom solder resist layer 114 and the bottom surface finish 118. The temporary protective layer 504 may cover all exposed surfaces of structures on the bottom side 110 to expose structures only on the top side 112. In an embodiment, the temporary protective layer 504 is formed of any suitable chemically resistant insulating material, such as polyethylene terephthalate (PET). The temporary protective layer 504 may prevent deposition of a surface finish on the bottom surface finish 118.

Figure 5F:
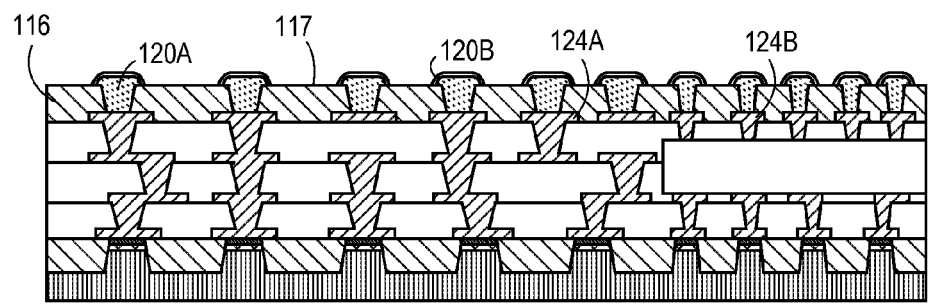

Thereafter, in FIG. 5F, a top surface finish 120 is formed on exposed surfaces of the top contact pads 124. The top surface finish 120 may be used to electrically couple the top contact pads 124 to device components 202 shown in FIG. 2. In an embodiment, the top surface finish 120 is formed of two layers: a first top surface finish 120A and a second top surface finish 120B. In an embodiment, the first top surface finish 120A is formed on the top contact pads 124 and on a portion of the top solder resist layer 116, and the second top surface finish 120B is formed on the first top surface finish 120A. The first and second top surface finishes 120A and 120B may be formed by any suitable deposition technique, such as electroless plating.

In an embodiment, the first top surface finish 120A is formed to a thickness at least three to four times larger than the thickness of the first bottom surface finish 118A. In a particular embodiment, the first top surface finish 120A is formed to a thickness ranging from 25 to 30 μm. In an embodiment, the second top surface finish 120B is formed to a thickness sufficient to prevent oxidation of the first top surface finish 120B. In a particular embodiment, the second top surface finish 120B is formed to a thickness ranging from 2-4 μm.

In an embodiment, the first and second top surface finishes 120A and 120B are formed of a conductive material, such as a metal Ni, Pd, Au, Ag, and combinations thereof. In a particular embodiment, the first top surface finish 120A is formed of Ni and the second top surface finish 120B is formed of PdAu. In an embodiment, the first top surface finish 120A is formed to a thickness sufficient to electrically couple the top contact pads 124A and 124B to device components. The first top surface finish 120A may be formed to a thickness such that the first top surface finish 120A extends beyond a top surface 117 of the top solder resist layer 116. In an embodiment, the first top surface finish 120A extends above the top surface 117 to make electrical connection with contacts of the device component 202, such as a memory chip or any other integrated circuit device. Micro bumps may therefore not be needed to form an electrical connection between the device component 202 and the top contact pads 124.

Figure 5G:
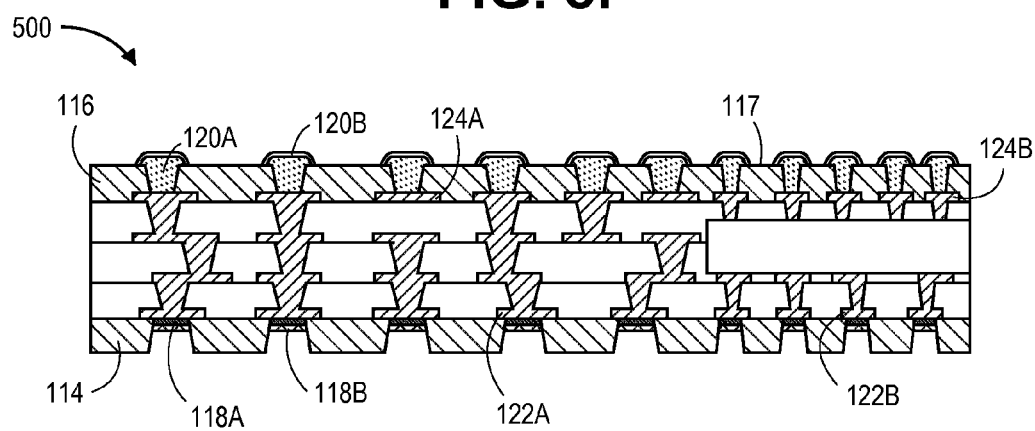

After the top surface finish 120 is formed, the temporary protective layer 504 is removed, as illustrated in FIG. 5G, thereby forming a coreless package substrate 500 with top and bottom surface finishes 120 and 118. Having solder resist layers on both sides of the coreless package substrate enables the method described in FIGS. 5A-5G of forming surface finishes with different thicknesses.

While the above method discussed in FIGS. 5A-5G describe application of the bottom surface finish 118 on the bottom contact pads 122 followed by application of the top surface finish 120 on the top contact pads 124, this method may be performed in the opposite order as well. For example, the top surface finish 120 may be applied to the top contact pads 124 followed by application of the bottom surface finish 118 on the bottom contact pads 122.

Figure 6:
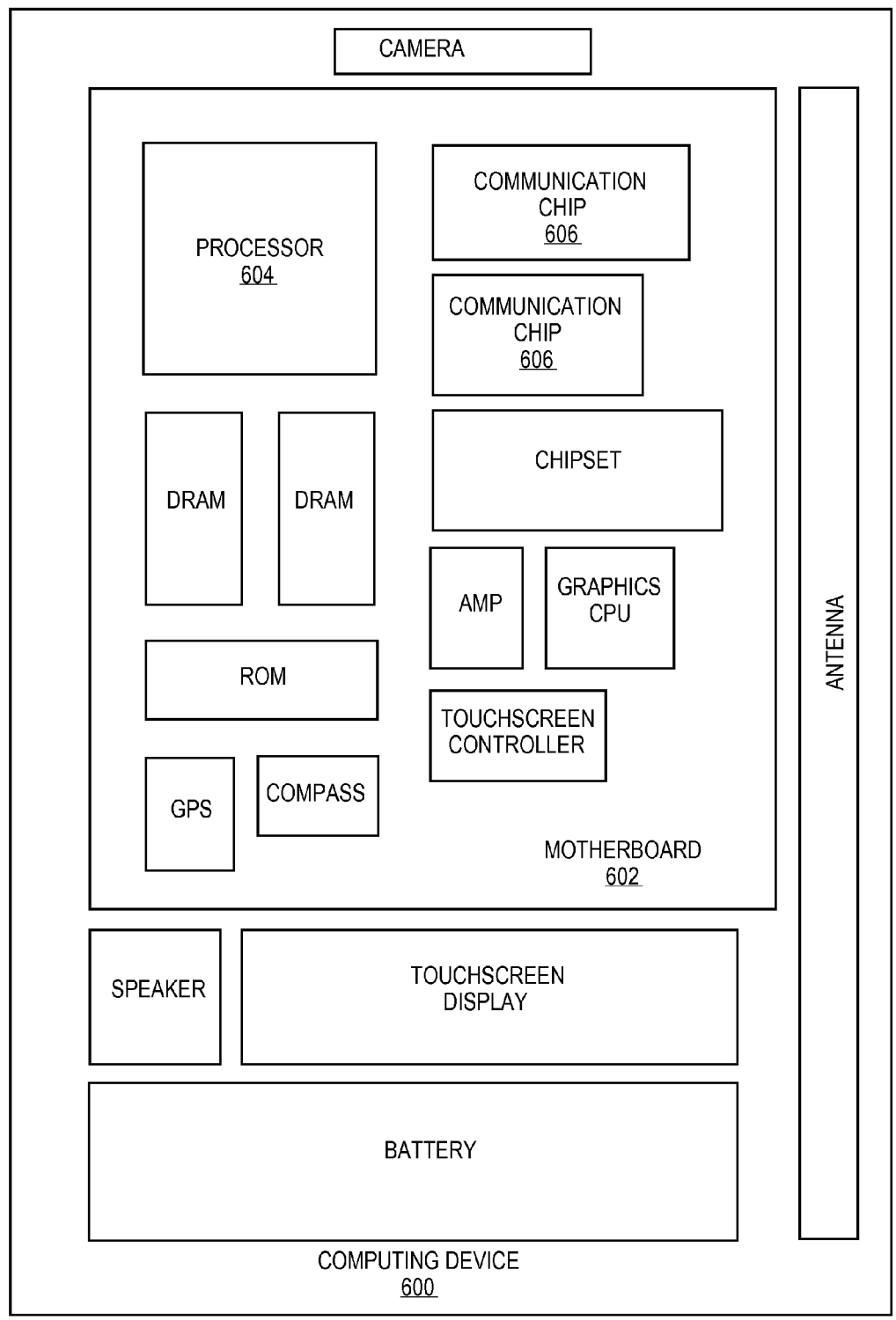
FIG. 6 illustrates a computing system implemented with one implementation of the invention.

FIG. 6 illustrates a computing system 600 implemented with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3I, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die is mounted on a package substrate, such as a coreless package substrate with dual side solder resist layers, that is formed in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die is mounted on a package substrate, such as a coreless package substrate with dual side solder resist layers, that is formed in accordance with implementations of the invention.

In further implementations, another component housed within the computing device 600 may contain an integrated circuit die that is mounted on a package substrate, such as a coreless package substrate with dual side solder resist layers, that is formed in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

In an embodiment, a package substrate includes a build-up structure comprising at least one insulating layer, at least one via, and at least one conductive layer, a first plurality of contact pads on a first side of the build-up structure, a second plurality of contact pads on a second side of the build-up structure opposite of the first side, a first solder resist layer on the first side; and a second solder resist layer on the second side, the first and second solder resist layers covering all exposed surfaces of the first and second sides of the build-up structure, respectively.

The build-up structure may not include a stiffening core. In an embodiment, the first solder resist layer is disposed an entire distance between the first plurality of contact pads and a bottommost insulating layer of the at least one insulating layer. The first solder resist layer may be disposed on sidewalls of the first plurality of contact pads. The first solder resist layer may be disposed on an internal side of the first plurality of contact pads. In an embodiment, the first solder resist layer is not disposed on an external side of the first plurality of contact pads. Additionally, in an embodiment, the first plurality of contact pads includes first wide contact pads and first narrow contact pads, the first wide contact pads having a pitch greater than the first narrow contact pads. The package substrate may also include a device embedded within the coreless package substrate. In an embodiment, the package substrate also includes a stiffening core disposed within the build-up structure. The second plurality of contact pads may include second wide contact pads and second narrow contact pads, the second wide contact pads having a pitch greater than the second narrow contact pads. In an embodiment, the first solder resist layer is not directly laterally adjacent to the first plurality of contact pads, and wherein the second solder resist layer is directly laterally adjacent to a portion of the second plurality of contact pads. Additionally, in an embodiment, the first solder resist layer is on a portion of the first plurality of contact pads. The second solder resist layer may be disposed on all exposed top surfaces of a topmost insulating layer of the at least one insulating layer.

In an embodiment, a method of forming a package substrate includes forming a plurality of multi-layered structures on a top surface of a temporary substrate, forming a first solder resist layer on exposed surfaces of the temporary substrate and the plurality of multi-layered structures, forming a build-up structure comprising least one insulating layer, a plurality of vias, and at least one conductive layer on the first solder resist layer, wherein a top conductive layer forms a second plurality of contact pads on a top surface of a topmost insulating layer, forming a second layer of solder resist on a top surface of the topmost insulating layer, exposing at least a portion of the second plurality of contact pads, and removing the temporary substrate and a portion of each multi-layered structure of the plurality of multi-layered structures, a remaining portion of each multi-layered structure forming a first plurality of contact pads.

Forming the build-up structure may include a semi-additive process. In an embodiment, forming the build-up structure further includes placing a device within the at least one insulating layer and at least one conductive layer such that the device is embedded within the build-up structure. Forming the build-up structure may also include etching through a portion of the first solder resist layer to expose the plurality of multi-layered structures. In an embodiment, forming the plurality of multi-layered structures includes forming a patterned dry film resistor layer on top of the temporary substrate, depositing a first layer on the patterned dry film resistor and on a top surface of the temporary substrate, depositing a second layer on top of the first layer, depositing a third layer on top of the second layer, and removing the patterned dry film resistor layer along with portions of the first, second, and third layers disposed on top of the patterned dry film resistor layer. Third layer may remain as the first plurality of contact pads following removal of the dry film resistor layer.

In an embodiment, a method of forming a package substrate includes providing a temporary substrate, forming a first plurality of contact pads on a top surface of the temporary substrate, forming at least one insulating layer and at least one conductive layer on the first plurality of contact pads, wherein a top conductive layer forms a second plurality of contact pads on a top surface of a topmost insulating layer, forming a first layer of solder resist on the top surface of the topmost insulating layer, exposing at least a portion of the second plurality of contact pads, removing the temporary substrate to expose a bottom surface of the bottommost insulating layer, temporarily planarizing the intermediate structure, and forming a second layer of solder resist on the bottom surface of the bottommost insulating layer, exposing at least a portion of the first plurality of contact pads.

Forming the first plurality of contact pads may include forming a patterned dry film resistor layer on top of the temporary substrate depositing a conductive layer on the patterned dry film resistor and on a top surface of the temporary substrate, and removing the patterned dry film resistor layer along with portions of the conductive layer disposed on top of the patterned dry film resistor layer such that left over portions of the conductive layer remain to form the first plurality of contact pads. In an embodiment, temporary flattening the intermediate structure includes inverting the intermediate structure and placing the intermediate structure on a vacuum fixture. In an embodiment, inverting the intermediate structure causes the bottom surface of the bottommost insulating layer to be exposed upward.

In an embodiment, a method of forming surface finishes on a package structure includes providing a coreless package substrate having a first side and a second side opposite of the first side, the coreless package substrate comprising a single build-up structure comprising at least one insulating layer, at least one via, and at least one conductive layer, a first plurality of contact pads on the first side, and a second plurality of contact pads on the second side, a first solder resist layer on the first side, and a second solder resist layer on the second side, forming a first protection layer on the first side of the coreless package substrate and depositing a bottom surface finish on the second plurality of contact pads, the bottom surface finish having a first thickness, removing the first protection layer from the first side of the coreless package substrate to expose one or more contact pads disposed on the first side, forming a second protection layer on the second side of the coreless package substrate and depositing a top surface finish on the first plurality of contact pads, the top surface finish having a second thickness different than the first thickness, and removing the second protection layer from the second side of the coreless package substrate.

At least one of the bottom surface finish and the top surface finish may extend above a top surface of the first solder resist layer and the second solder resist layer, respectively. In an embodiment, depositing a bottom surface finish and a top surface finish includes depositing a first conductive material and a second conductive material directly on the first conductive material. In an embodiment, depositing the first and second conductive materials include electroless plating. The first conductive material may include nickel. The second conductive material may include gold and palladium. In an embodiment, the second thickness is a magnitude of three to four times a thickness of the first thickness.

In utilizing the various aspects of this invention, it would become apparent to one skilled in the art that combinations or variations of the above embodiments are possible for forming a coreless package substrate with dual solder resist layers. Although embodiments of the present invention have been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating embodiments of the present invention.

What is claimed is:
1. A package substrate, comprising:
 a build-up structure comprising at least one insulating layer, at least one via, and at least one conductive layer;
 a first plurality of contact pads in a first side of the build-up structure, the first plurality of contact pads each having an external surface co-planar with the first side of the build-up structure;
 a second plurality of contact pads on a second side of the build-up structure opposite of the first side;

a first solder resist layer on the first side of the build-up structure; and a second solder resist layer on the second side of the build-up structure, the first and second solder resist layers covering the first and second sides of the build-up structure, respectively, wherein the first solder resist layer is disposed on sidewalls of the first plurality of contact pads and is not formed on the external surfaces of the first plurality of contact pads, and the second solder resist layer is formed on a portion of the second plurality of contact pads on the second side of the build-up structure.

2. The package substrate of claim 1, wherein the build-up structure does not include a stiffening core.

3. The package substrate of claim 1, wherein the first solder resist layer is disposed an entire distance between the first plurality of contact pads and a bottommost insulating layer of the at least one insulating layer.

4. The package substrate of claim 1, wherein the first solder resist layer is disposed on an internal side of the first plurality of contact pads.

5. The package substrate of claim 1, wherein the first plurality of contact pads comprises a first set of contact pads and a second set of contact pads, the first set of contact pads having a pitch greater than the second set of contact pads.

6. The package substrate of claim 1, further comprising a device embedded within the package substrate.

7. The package substrate of claim 1 further comprising a stiffening core disposed within the build-up structure.

8. The package substrate of claim 6, wherein the second plurality of contact pads comprises a third set of contact pads and a fourth set of contact pads, the third set of contact pads having a pitch greater than the fourth set of contact pads.

9. The package substrate of claim 1, wherein the second solder resist layer is directly laterally adjacent to a portion of the second plurality of contact pads.

10. The package substrate of claim 1, wherein the second solder resist layer is disposed on all exposed top surfaces of a topmost insulating layer of the at least one insulating layer.

11. A package substrate, comprising:
a build-up structure comprising at least one insulating layer, at least one via, and at least one conductive layer;
a first plurality of contact pads in a first side of the build-up structure, the first plurality of contact pads each having an external surface co-planar with the first side of the build-up structure;
a second plurality of contact pads on a second side of the build-up structure opposite of the first side;
a first solder resist layer on the first side of the build-up structure; and
a second solder resist layer on the second side of the build-up structure, the first and second solder resist layers covering the first and second sides of the build-up structure, respectively, wherein the first solder resist layer is disposed an entire distance between the first plurality of contact pads and a bottommost insulating layer of the at least one insulating layer and is not formed on the external surfaces of the first plurality of contact pads, and the second solder resist layer is formed on a portion of the second plurality of contact pads on the second side of the build-up structure.

12. The package substrate of claim 11, wherein the build-up structure does not include a stiffening core.

13. The package substrate of claim 11, wherein the first plurality of contact pads comprises a first set of contact pads and a second set of contact pads, the first set of contact pads having a pitch greater than the second set of contact pads.

14. The package substrate of claim 11, further comprising a device embedded within the package substrate.

15. The package substrate of claim 11, further comprising a stiffening core disposed within the build-up structure.

16. The package substrate of claim 11, wherein the second plurality of contact pads comprises a third set of contact pads and a fourth set of contact pads, the third set of contact pads having a pitch greater than the fourth set of contact pads.

17. The package substrate of claim 11, wherein the second solder resist layer is directly laterally adjacent to a portion of the second plurality of contact pads.

18. The package substrate of claim 11, wherein the second solder resist layer is disposed on all exposed top surfaces of a topmost insulating layer of the at least one insulating layer.

19. A package substrate, comprising:
a build-up structure comprising at least one insulating layer, at least one via, and at least one conductive layer;
a first plurality of contact pads in a first side of the build-up structure, the first plurality of contact pads each having an external surface co-planar with the first side of the build-up structure;
a second plurality of contact pads on a second side of the build-up structure opposite of the first side;
a first solder resist layer on the first side of the build-up structure; and
a second solder resist layer on the second side of the build-up structure, the first and second solder resist layers covering the first and second sides of the build-up structure, respectively, wherein the first solder resist layer is disposed on an internal side of the first plurality of contact pads and is not formed on the external surfaces of the first plurality of contact pads, and the second solder resist layer is formed on a portion of the second plurality of contact pads on the second side of the build-up structure.

20. The package substrate of claim 19, wherein the build-up structure does not include a stiffening core.

21. The package substrate of claim 19, wherein the first plurality of contact pads comprises a first set of contact pads and a second set of contact pads, the first set of contact pads having a pitch greater than the second set of contact pads.

22. The package substrate of claim 19, further comprising a device embedded within the package substrate.

23. The package substrate of claim 19, further comprising a stiffening core disposed within the build-up structure.

24. The package substrate of claim 19, wherein the second plurality of contact pads comprises a third set of contact pads and a fourth set of contact pads, the third set of contact pads having a pitch greater than the fourth set of contact pads.

25. The package substrate of claim 19, wherein the second solder resist layer is directly laterally adjacent to a portion of the second plurality of contact pads.

* * * * *